(12) United States Patent
Loubet et al.

(10) Patent No.: US 10,916,627 B2
(45) Date of Patent: Feb. 9, 2021

(54) NANOSHEET TRANSISTOR WITH FULLY ISOLATED SOURCE AND DRAIN REGIONS AND SPACER PINCH OFF

(71) Applicant: International Business Machines Corporation, Armonk, NY (US)

(72) Inventors: Nicolas Loubet, Guilderland, NY (US); Pietro Montanini, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/362,030

(22) Filed: Mar. 22, 2019

(65) Prior Publication Data

US 2020/0303500 A1    Sep. 24, 2020

(51) Int. Cl.
*H01L 29/06*    (2006.01)
*H01L 29/78*    (2006.01)
(Continued)

(52) U.S. Cl.
CPC .... *H01L 29/0673* (2013.01); *H01L 21/02532* (2013.01); *H01L 21/0337* (2013.01);
(Continued)

(58) Field of Classification Search
CPC ............. H01L 29/0673; H01L 29/0657; H01L 29/0665; H01L 29/1033; H01L 29/66795;
(Continued)

(56) References Cited

U.S. PATENT DOCUMENTS 9,947,804 B1    4/2018    Frougier et al.
2011/0284932 A1    11/2011    Chou et al.
(Continued)

FOREIGN PATENT DOCUMENTS

CN    103165536 A    6/2013

OTHER PUBLICATIONS

"Nanosheet Dielectric Isolation through Self-Aligned Directional Process", IP.com; Electronic publication date: Mar. 22, 2018; 8 pages.
Chieng K., "FinFET Technology", ECS Transactions, vol. 80, No. 4, 2017; pp. 17-31.

*Primary Examiner* — Zandra V Smith
*Assistant Examiner* — Molly K Reida
(74) *Attorney, Agent, or Firm* — Cantor Colburn LLP; Douglas Pearson (57) ABSTRACT

A semiconductor device includes a plurality of nano sheet stacks disposed above a substrate. Each nanosheet stack has a first nanosheet and a first sacrificial layer, the first nanosheet and the first sacrificial layer each include a first end and a second end. The first end and the second end of the first sacrificial layer are recessed from the first and second ends of the first nanosheet. Each nanosheet stack has a bottom sacrificial layer formed on top of the substrate. The bottom sacrificial layer has a first end and a second end, which are recessed from the first and second ends of the first nanosheet. The semiconductor also has a source or drain (S/D) structures formed in contact with the first end and the second end of the first nanosheet. The S/D structures are isolated from the substrate by the bottom sacrificial layer.

11 Claims, 6 Drawing Sheets

(51) Int. Cl.
  *H01L 21/8234* (2006.01)
  *H01L 29/66* (2006.01)
  *H01L 29/161* (2006.01)
  *H01L 21/033* (2006.01)
  *H01L 21/02* (2006.01)
  *H01L 27/088* (2006.01)

(52) U.S. Cl.
  CPC ........ *H01L 21/823412* (2013.01); *H01L 21/823418* (2013.01); *H01L 21/823431* (2013.01); *H01L 21/823437* (2013.01); *H01L 27/0886* (2013.01); *H01L 29/0642* (2013.01); *H01L 29/161* (2013.01); *H01L 29/6681* (2013.01); *H01L 29/66545* (2013.01); *H01L 29/785* (2013.01)

(58) Field of Classification Search
  CPC ........ H01L 29/785; H01L 21/823412; H01L 21/823418; H01L 21/823431; H01L 21/823468
  See application file for complete search history.

(56) References Cited

U.S. PATENT DOCUMENTS

| | | |
|---|---|---|
| 2017/0170294 A1 | 6/2017 | Doris et al. |
| 2018/0083118 A1 | 3/2018 | Bergendahl et al. |
| 2018/0122706 A1 | 5/2018 | Cheng et al. |
| 2019/0109040 A1* | 4/2019 | Chao ............... H01L 29/6681 |

* cited by examiner

NANOSHEET TRANSISTOR WITH FULLY ISOLATED SOURCE AND DRAIN REGIONS AND SPACER PINCH OFF

BACKGROUND

The present invention generally relates to fabrication methods and resulting structures for integrated circuit (IC) devices. More specifically, the present invention relates to a nanosheet transistor having fully isolated source and drain regions with a spacer pinch off.

As semiconductor integrated circuits (ICs) become smaller, nanosheet transistors are increasingly used. A nanosheet transistor refers to a type of field-effect transistor (FET) that includes a plurality of stacked nanosheets extending between a pair of source/drain epitaxial regions. FETs typically include doped source/drain epitaxial regions that are formed in a semiconductor substrate and separated by a channel region. A gate insulation layer is positioned above the channel region and a conductive gate electrode is positioned above the gate insulation layer. Examples of FETs can include a metal-oxide-semiconductor field effect transistor (MOSFET) and an insulated-gate field-effect transistor (IGFET).

SUMMARY

According to a non-limiting embodiment of the present invention, a semiconductor device is provided. The semiconductor device includes a plurality of nanosheet stacks disposed above a substrate. Each nanosheet stack has a first nanosheet and a first sacrificial layer, the first nanosheet and the first sacrificial layer each include a first end and a second end. The first end and the second end of the first sacrificial layer are recessed from the first and second ends of the first nanosheet. Each nanosheet stack has a bottom sacrificial layer formed on top of the substrate. The bottom sacrificial layer has a first end and a second end, which are recessed from the first and second ends of the first nanosheet. The semiconductor also has a source or drain structures formed in contact with the first end and the second end of the first nanosheet. The S/D structures are isolated from the substrate by the bottom sacrificial layer.

Embodiments of the present invention are further directed to a method for fabricating a semiconductor device. A non-limiting example of the method includes forming a plurality of nanosheet stacks disposed above a substrate, each nanosheet stack including a first nanosheet and a first sacrificial layer. The first nanosheet and the first sacrificial layer each having a first end and a second end. The nanosheet stack further includes a bottom sacrificial layer formed on top of the substrate. The bottom sacrificial layer has a first end and a second end. The first end and the second end of the bottom sacrificial layer recessed from the first and second ends of the first nanosheet. Further, the method provides for forming a gate structure on each nanosheet stack and subsequently removing a portion of the first and second ends of the first sacrificial layer, and a portion of the first and second ends of the bottom sacrificial layer to expose portions of the first nanosheet. The method also includes forming an interlayer dielectric (ILD) layer around the plurality of nanosheet stacks in source or drain (S/D) regions and forming a S/D structures in the S/D regions in contact with the first end and the second end of the first nanosheet. The S/D structures being isolated from the substrate by the bottom sacrificial layer.

According to yet another non-limiting embodiment, a method of fabricating a semiconductor device includes forming a plurality of nanosheet stacks disposed above a substrate. Each nanosheet stack including a plurality of vertically-stacked nanosheets having a first end and a second end alternating with a plurality of sacrificial layers having a first end and a second end disposed above the first nanosheet, such that each nanosheet is separated by a sacrificial layer and such that the substrate is separated from the nanosheet stack by a bottom sacrificial layer. The method further includes forming a gate structure on each nanosheet stack and removing a portion of the first and second ends of the first sacrificial layers, and a portion of the first and second ends of the bottom sacrificial layer to expose portions of the first nanosheet. In addition, the method provides for forming an interlayer dielectric (ILD) layer around the plurality of nanosheet stacks in source or drain (S/D) regions and a S/D structures in the S/D regions in contact with the first end and the second end of the vertically-stacked nanosheets. The S/D structures are isolated from the substrate by the bottom sacrificial layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings.

FIGS. 1-6 depict cross-sectional views of a semiconductor device after fabrication operations for forming an IC having a fully isolated source and drain regions in accordance with embodiments of the invention, in which:

FIG. 2 depicts a cross-sectional view illustrating fabrication operations in accordance with embodiments of the invention;

FIG. 3 depicts a cross-sectional view illustrating fabrication operations in accordance with embodiments of the invention;

FIG. 4 depicts a cross-sectional view illustrating fabrication operations in accordance with embodiments of the invention;

FIG. 5 depicts a cross-sectional view illustrating fabrication operations in accordance with embodiments of the invention; and FIG. 6 depicts a cross-sectional view illustrating fabrication operations in accordance with embodiments of the invention.

FIGS. 7-12 depict cross-sectional views of a semiconductor device after fabrication operations for forming an IC having a bottom sacrificial layer of a nanosheet stack that contains higher content of germanium (Ge) than sacrificial layers of the nanosheet stack in accordance with embodiments of the invention, in which:

FIG. 7 depicts a cross-sectional view illustrating fabrication operations in accordance with embodiments of the invention;

FIG. 8 depicts a cross-sectional view illustrating fabrication operations in accordance with embodiments of the invention;

FIG. 9 depicts a cross-sectional view illustrating fabrication operations in accordance with embodiments of the invention;

FIG. 10 depicts a cross-sectional view illustrating fabrication operations in accordance with embodiments of the invention;

In the accompanying figures and following detailed description of the described embodiments, the various elements illustrated in the figures are provided with two, three or four digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a more detailed description of technologies relevant to aspects of the present invention, non-planar device architectures, such as vertical fin and nanosheet FET devices, result in increased device density over lateral devices. However, there are challenges in providing non-planar FETs having equal or superior performance characteristics to lateral devices. For example, some non-planar devices require careful management of transistor drive currents while reducing short-channel effects, parasitic capacitance and off-state leakage. Nanosheet-based FET devices provide a non-planar device topology that advantageously enables improved control of short channel effects. For example, in nanosheet-based transistors the gate stack wraps around the full perimeter of the nanosheet, enabling fuller depletion in the channel region, and reducing short-channel effects due to steeper sub-threshold current swing (SS) and smaller drain induced barrier lowering (DIBL). Wraparound gate structures and source/drain contacts used in nanosheet devices also enable greater management of leakage and capacitance in the active regions, even as drive currents increase.

The fabrication of nanosheet FET semiconductor structures requires forming inner spacers between adjacent nanosheets. The inner spacers can be any insulating material, such as, for example, a low-k dielectric material. The inner spacers act to reduce the parasitic overlap capacitance between the gate and the source/drain epitaxy regions. Parasitic capacitance, or conductor-to-conductor capacitance, between two conductors is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices.

Further, as dimensions of nanosheet FET devices continue to shrink, maintaining control of various electrical characteristics, for example, off-state leakage, becomes increasingly more challenging. Channel-to-substrate leakage in a FET device can be prevented by inserting an insulating layer between the semiconducting channel (fin) and the substrate. Similarly, source/drain-to-substrate leakage in a FET device can be prevented by isolating the source/drain regions from the substrate by inserting an insulating layer between the source/drain regions and the substrate. The insulating layer isolates the conduction path from the substrate both physically and electrically, thereby preventing current leakage. Thus, embodiments of the invention address the above-described shortcoming of the prior art by providing, inter alia, methods of fabricating a semiconductor device having a simultaneously formed inner spacer structure and fully isolated source and drain regions.

Figure 1:
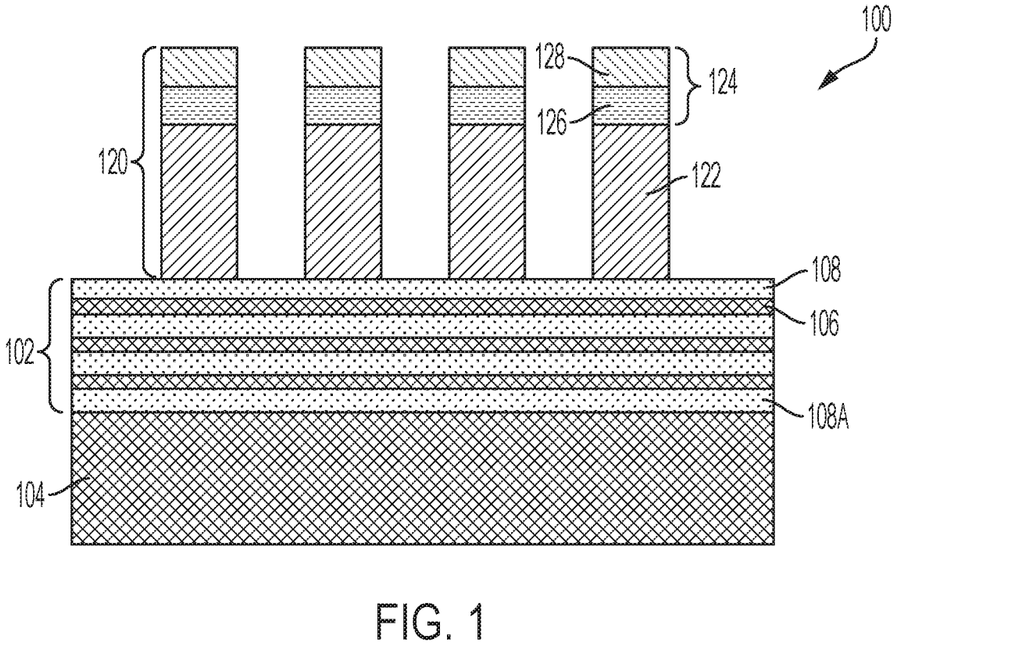
FIG. 1 depicts a cross-sectional view illustrating a structure that results from performing initial fabrication operations in accordance with embodiments of the invention.

Turning now to a more detailed description of aspects of the present invention, as shown in further detail below by referring to the accompanying drawings in FIGS. 1-12. Referring initially to FIG. 1, there is shown a cross-sectional view of a portion of a semiconductor structure 100 after fabrication operations for forming on/in the structure 100 an arrangement of IC components having a nanosheet stack 102 formed, for example, by epitaxial growth, on a substrate 104 during an intermediate operation of a method of fabricating a semiconductor device according to embodiments of the present invention. The nanosheet stack 102 includes vertically-stacked nanosheets 106, alternating with sacrificial layers 108. According to embodiments of the present invention, the sacrificial layers 108 include a bottom sacrificial layer 108A formed on the substrate 104. For ease of discussion reference is made to operations performed on and to a nanosheet stack having three nanosheets 106. It is understood, however, that the nanosheet stack 102 can include any number of nanosheets alternating with a corresponding number of sacrificial layers.

The nanosheets 106 can be any suitable material, for example, monocrystalline silicon. The substrate 104 can be any suitable substrate material, for example, monocrystalline Si, SiC, or semiconductor-on-insulator (SOI). According to embodiments of the invention, the sacrificial layers 108 can be silicon germanium (SiGe) having a germanium (Ge) content of 25% to 50%. The sacrificial layers 108 can be silicon germanium (SiGe) layers having a thickness of about 4 nm to about 10 nm. The sacrificial layers 108 can be formed to the same thickness or can vary in thickness depending on applications. Similarly, when the nanosheet stack 102 includes multiple nanosheets 106, each nanosheet 106 within the nanosheet stack 102 can be formed to the same thickness or can vary in thickness, depending on applications.

In FIG. 1 known semiconductor fabrication operations have been used to form a plurality of sacrificial gate structures 120 (alternatively known as "dummy gates") on the nanosheet stack 102. Each sacrificial gate structure 120 includes a sacrificial gate 122. Each of the sacrificial gate structures 120 further includes a hard mask 124, formed of any suitable material, for example, silicon oxide, SiN, silicon oxynitride, boron nitride, or any suitable combination of those materials. According to embodiments of the present invention, the hard mask 124 can include an insulator layer 126 composed of a nitride or oxide material positioned beneath a masking layer 128.

Figure 2:
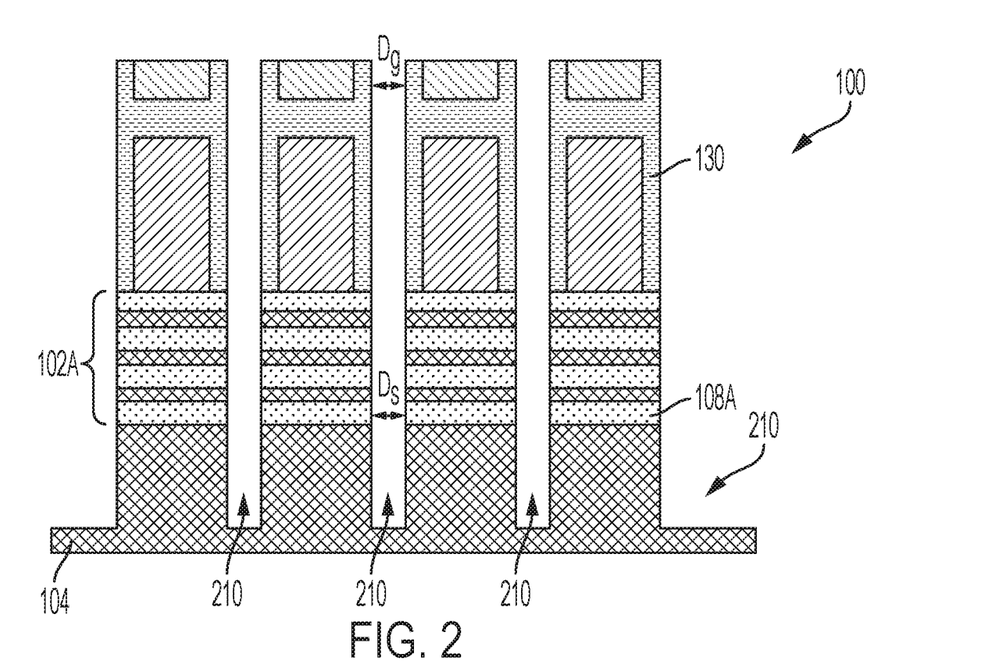

As shown in FIG. 2, known semiconductor fabrication operations have been used to form gate spacers 130 on sidewalls of the sacrificial gates 122 and the hard mask 124. The gate spacers 130 can be formed by deposition and etching techniques. Suitable spacer materials can include oxides such as silicon oxide (SiO2), nitrides such as silicon nitride (SiN), and/or low-K materials such as carbon-doped oxide materials containing silicon (Si), carbon (C), oxygen (O), and nitrogen (N) (SiOCN) or siliconborocarbonitride (SiBCN). The term "low-η" as used herein refers to a material having a relative dielectric constant η which is lower than that of silicon nitride.

In FIG. 2, known fabrication operations have been used to form a plurality of nanosheet stacks 102A by recessing portions of the nanosheet stack 102 and the substrate 104 that are not covered by the sacrificial gate structures 120 sufficiently deep to expose to expose source and drain (S/D) regions 210. Moreover, the nanosheet stack 102 and the substrate 104 are recessed with over etch under the bottom sacrificial layer 108A, so that a separation distance "Dg" between the sacrificial gate structures 120 is greater than a separation distance "Ds" between the nanosheets stacks 102A. Any known manner of removing portions of the nanosheet stack 102 and the substrate 104 can be utilized. In some embodiments, the portions are removed using a RIE process.

Figure 3:
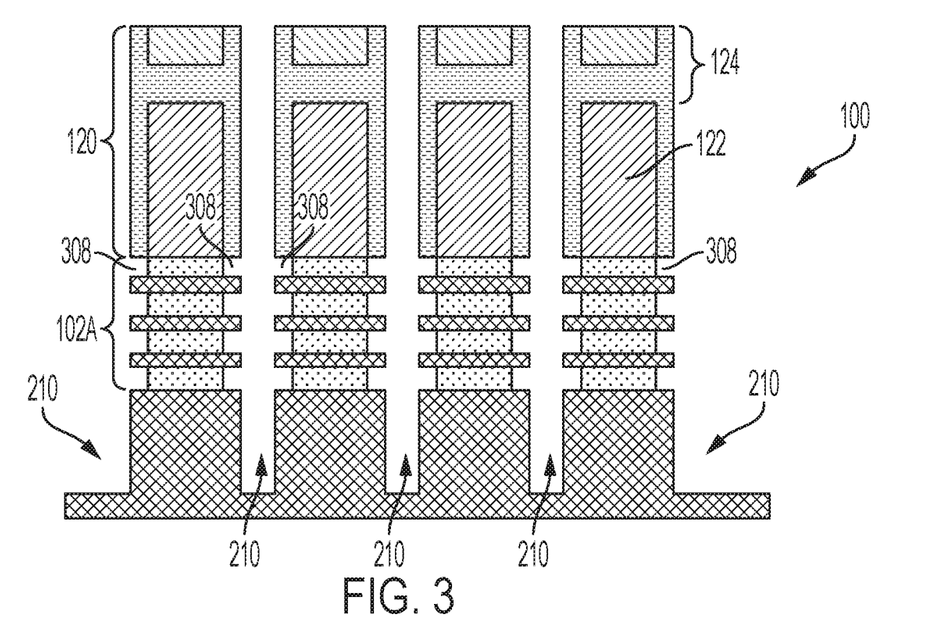

In FIG. 3 known fabrication operations have been used to form recess regions 308 on each end of the sacrificial layers 108 of the nanosheet stacks 102A by removing portions of the sacrificial layers 108. Forming the recessed regions 308 exposes portions of the nanosheets 106. According to embodiments of the present invention, the sacrificial layers 108 are SiGe and a lateral etch is employed to selectively etch back the SiGe to form the recessed regions 308. The lateral etch can be, for example, a RIE or wet etch. In addition, the selective removal of the portions of the sacrificial layers 108 can be performed by hydrochloride gas at a temperature ranging from about 500° C. to about 800° C.

Figure 4:
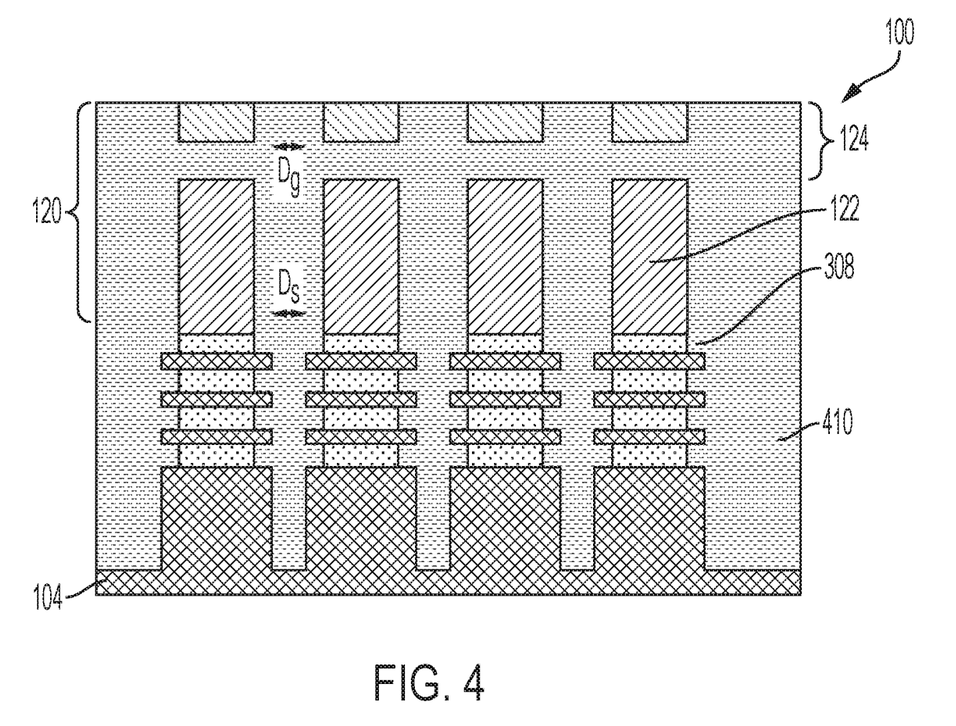

FIG. 4 illustrates an interlayer dielectric (ILD) material 410 being deposited in the S/D regions 210 to surround the nanosheets stacks 102A. As shown in FIG. 4, the recess regions 308 are also being filled with the ILD material 410, thereby forming "pinch off" in the recess regions 308 between the nanosheets 106, and the nanosheet stacks 102A and the substrate 104. The ILD material 410 is substantially coplanar with the upper surfaces of the nanosheets stacks 102A following a chemical mechanical polishing (CMP) process. The ILD material 410 can be any suitable material, such as, for example, porous silicates, carbon doped oxides, silicon dioxides, silicon nitrides, silicon oxynitrides, or other dielectric materials. The ILD material 410 can be formed using, for example, chemical vapor deposition (CVD), plasma enhanced chemical vapor deposition, atomic layer deposition, flowable CVD, spin-on dielectrics, or physical vapor deposition.

Figure 5:
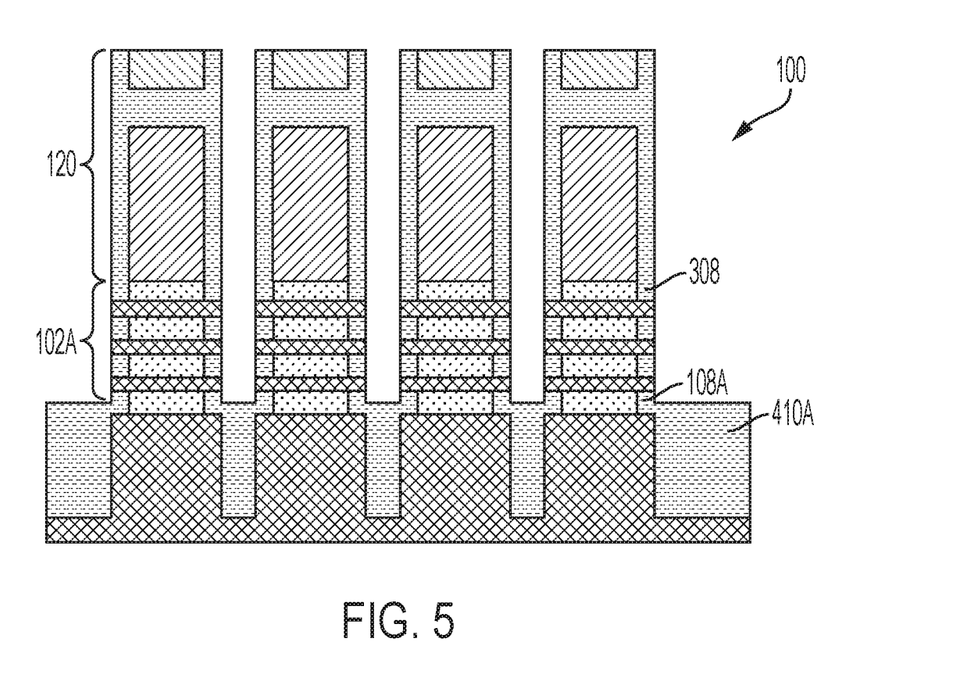

FIG. 5 illustrates the formation of an ILD material layer 410A by recessing the ILD material 410 so that the top surface of the ILD material layer 410A coplanar with the bottom sacrificial layer 108A. The ILD material 410 can be recessed by using a wet chemical etching process and RIE.

Figure 6:
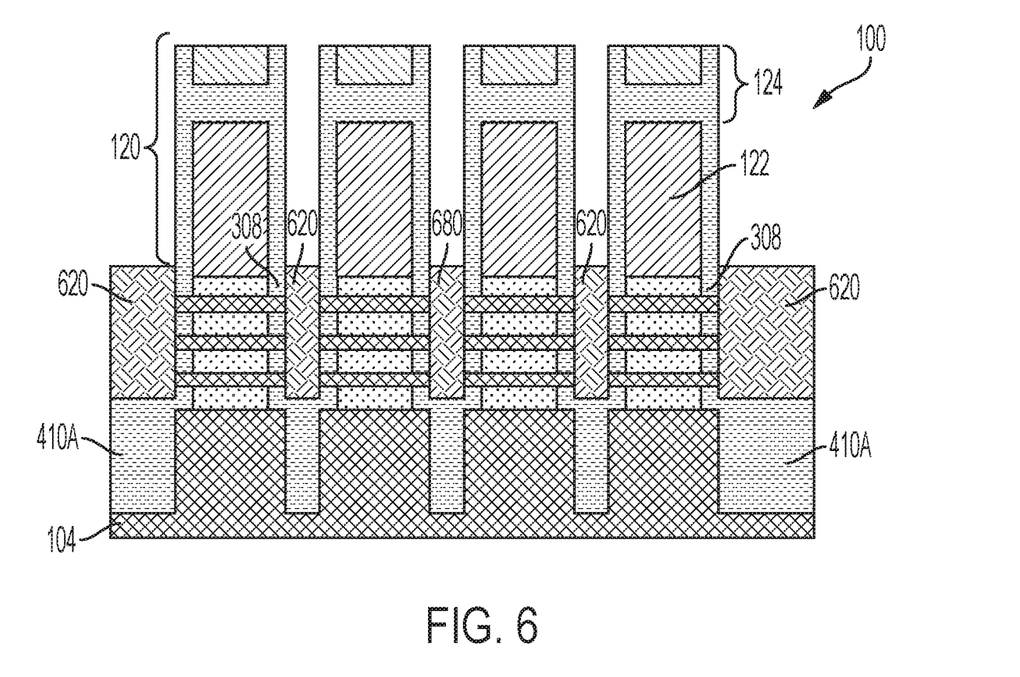

In FIG. 6 known fabrication operations have been used to form S/D structures 620 in the S/D regions 210 (shown in FIG. 2). The S/D structures 620 are formed on the substrate 104, such that each nanosheet 106 in contact with the S/D structures 620 on both sides of the nanosheet 106. However, there is no contact between the S/D structures 620 and the substrate 104. The S/D structures 620 are formed in the substrate 104 by a variety of known methods and can be doped by, for example, in-situ doping during epitaxial growth and/or diffusion and/or ion implantation.

FIGS. 7-12 show another alternative embodiment of the present invention where a bottom sacrificial layer 708B of a nanosheet stack 702 can contain higher content of Ge than sacrificial layers 708 of the nanosheet stack 702.

Figure 7:
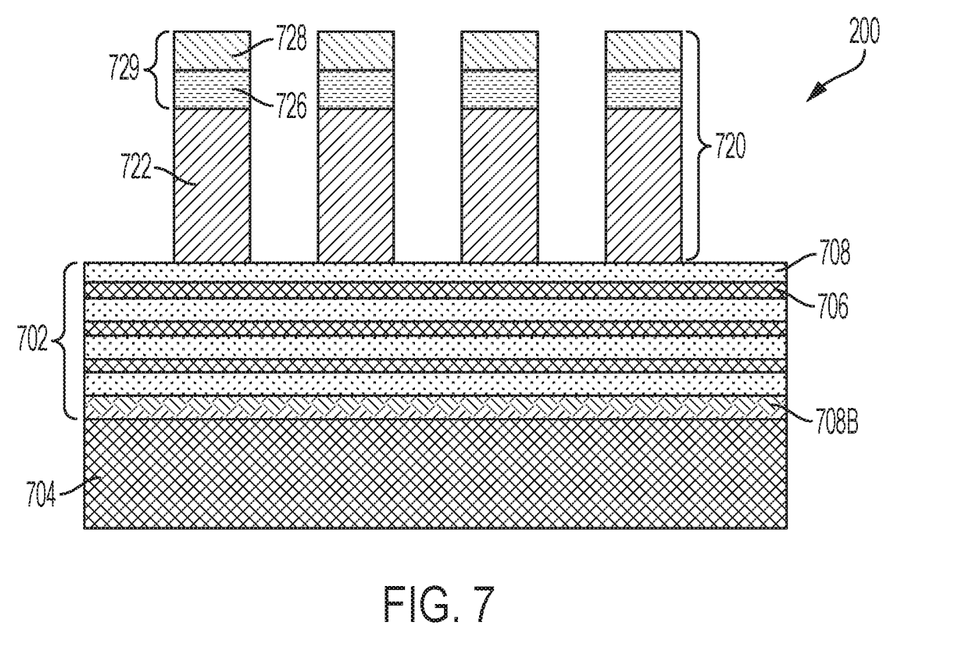

FIG. 7 illustrates a cross-sectional view of a structure 200 after an initial set of fabrication operations having the nanosheet stack 702 and a substrate 704. The nanosheet stack 702 includes vertically-stacked nanosheets 706, alternating with sacrificial layers 708 that include the bottom sacrificial layer 708B, formed on the substrate 704. The nanosheets 706 can be any suitable material, for example, monocrystalline silicon. The substrate 104 can be any suitable substrate material, for example, monocrystalline Si, SiC, or semiconductor-on-insulator (SOI). The sacrificial layers 708 and the bottom sacrificial layer 708B can be SiGe having a Ge content of 25%. However, according to embodiments of the invention, the sacrificial layers 708 and the bottom sacrificial layer 708B can have a different content of Ge. For example, the sacrificial layers 708 can have Ge content of 25%, while the bottom sacrificial layer 708B can have a Ge content of 50%.

The sacrificial layers 708 the bottom sacrificial layer 708B can be formed to the same thickness or can vary in thickness, depending on applications of the IC. Similarly, when the nanosheet stack 702 includes multiple nanosheets 706, each nanosheet 706 within the nanosheet stack 702 can be formed to the same thickness or can vary in thickness, depending on applications.

In FIG. 7, known fabrication operations have been used to form a plurality of sacrificial gate structures 720 on the nanosheet stack 702. Each sacrificial gate structure 720 includes a sacrificial gate 722, a hard mask 724 and gate spacers 730 (shown in FIG. 8). The hard mask 724 can include an insulator layer 726 composed of a nitride or oxide material positioned beneath a masking layer 728.

Figure 8:
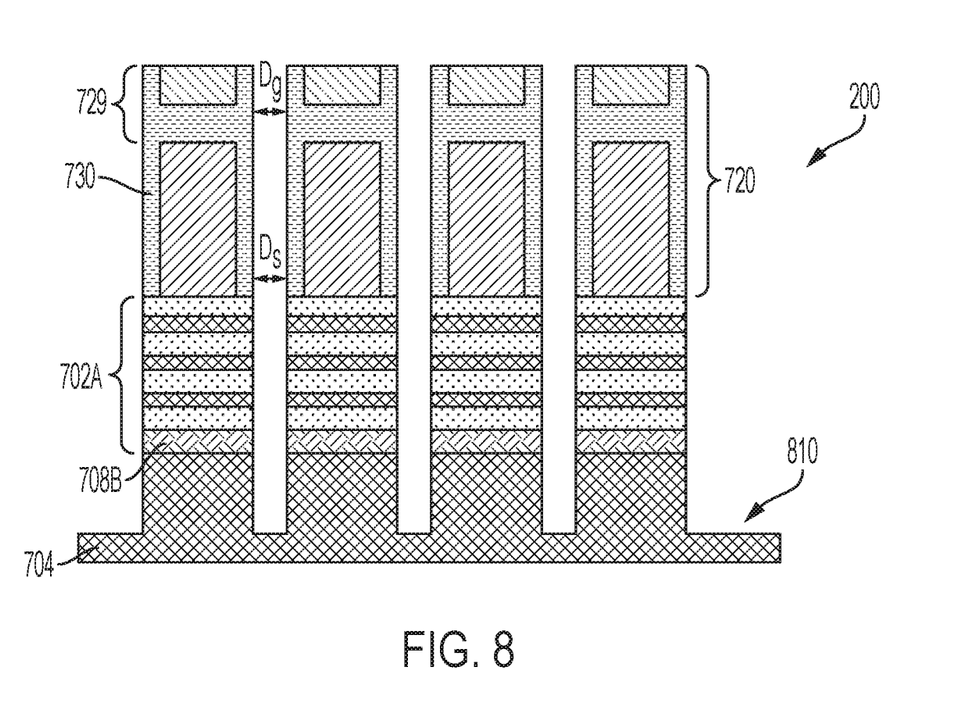

As illustrated in FIG. 8, known fabrication operations have been used to recess portions of the nanosheet stack 702 and the substrate 704 that are not covered by the sacrificial gate structures 720 to expose source and drain (S/D) regions 810 and to form a plurality of nanosheet stacks 702A. The nanosheet stacks 702 and the substrate 704 are recessed with over etch under the bottom sacrificial layers 108B so that the separation distance "Dg" between the sacrificial gate structures 720 is greater than the separation distance "Ds" between the nanosheets stacks 702A.

Figure 9:
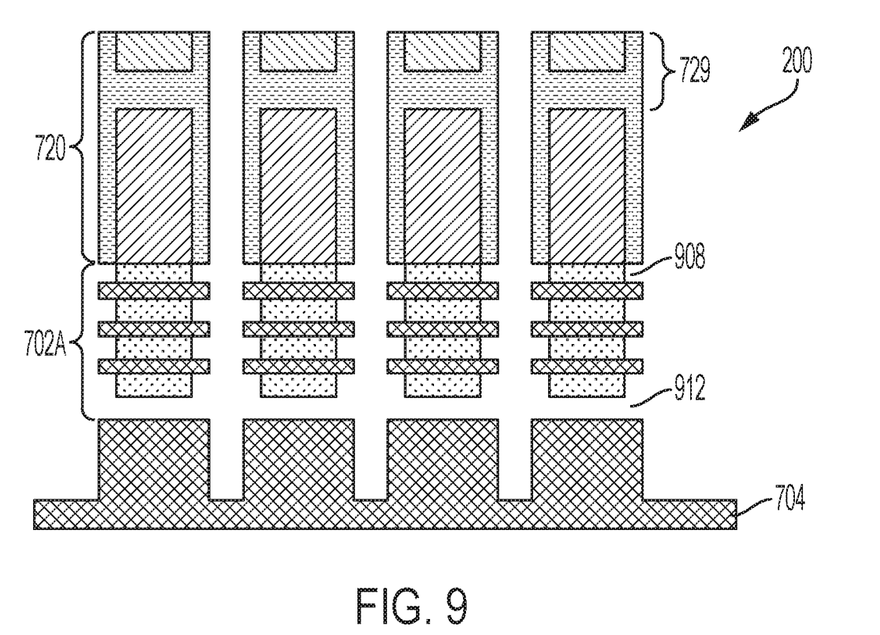

In FIG. 9 recess regions 908 are formed on opposite ends of the nanosheet stacks 702A by removing portions of the sacrificial layers 708. However, the bottom sacrificial layer 708B is fully removed to form a sacrificial bottom region 912. The selective removal of the portions of the sacrificial layers 708 and complete removal of the bottom sacrificial layer 708B can be performed by hydrochloride gas at a temperature ranging from about 500° C. to about 800° C. or any other suitable method, such as a lateral etch.

Figure 10:
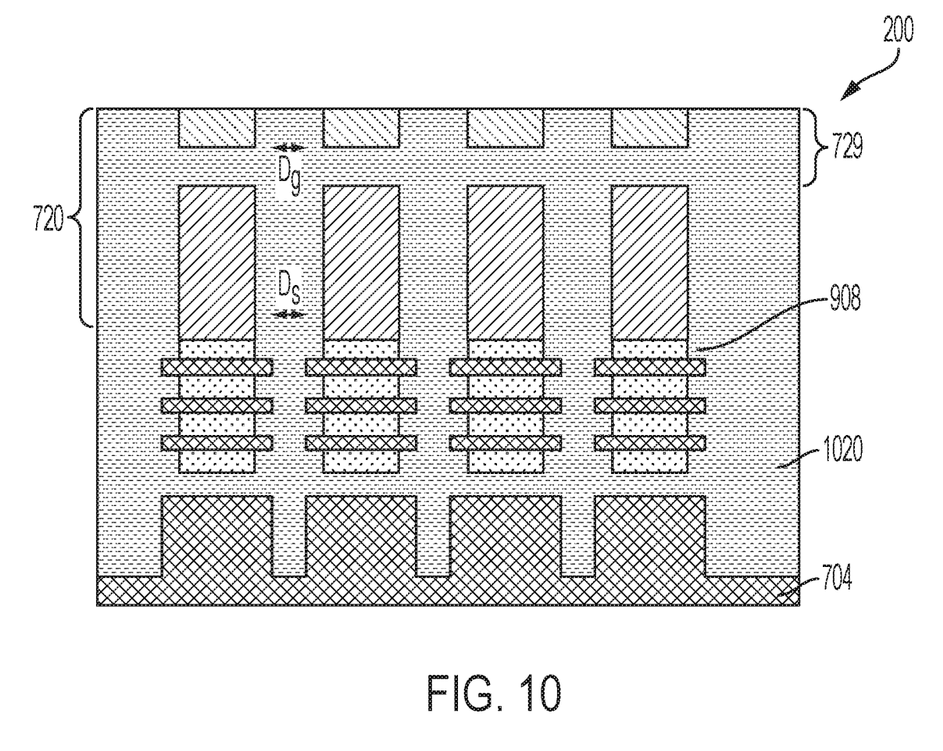

FIG. 10 illustrates an interlayer dielectric (ILD) material 1020 being deposited in the S/D regions 810 to surround the nanosheets stacks 702A. As shown in FIG. 10, the recess regions 908 and sacrificial bottom region 912 are filled with the ILD material 1020, thereby forming "pinch off" in the recess regions 908 between the nanosheets 706, and the nanosheet stacks 702A and the substrate 704. The ILD material 1020 is substantially coplanar with the upper surfaces of the nanosheets stacks 702A following a chemical mechanical polishing (CMP) process.

Figure 11:
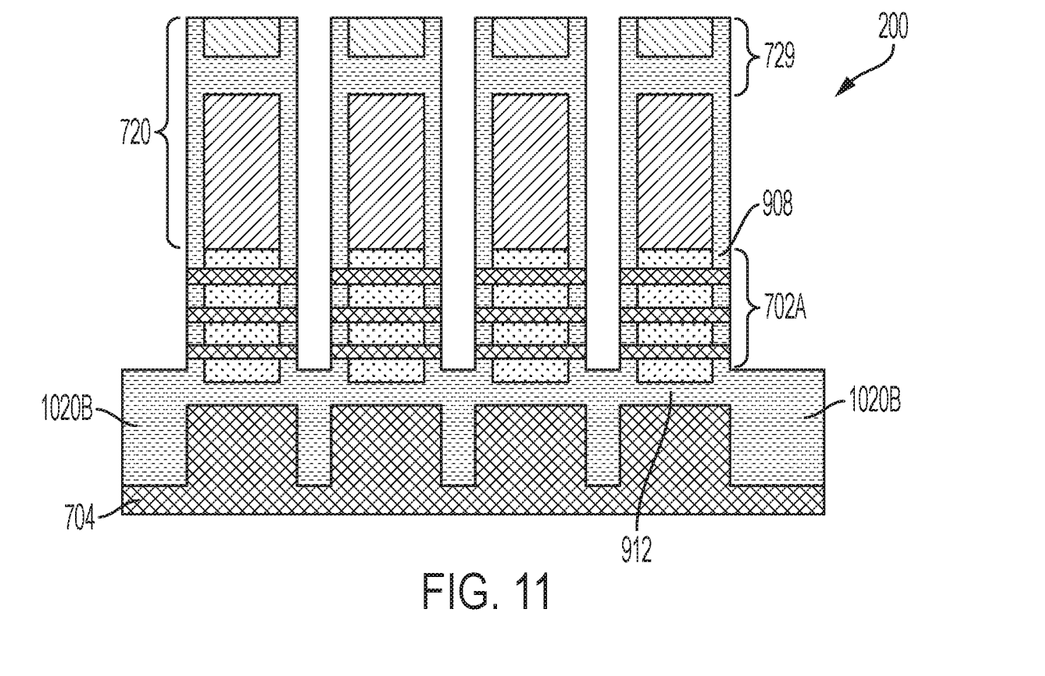
FIG. 11 depicts a cross-sectional view illustrating fabrication operations in accordance with embodiments of this invention.

FIG. 11 illustrates the formation of an ILD material layer 1020B by recessing the ILD material 1020 so that the top surface of the ILD material layer 1020B coplanar with the top surface of the sacrificial bottom region 912.

Figure 12:
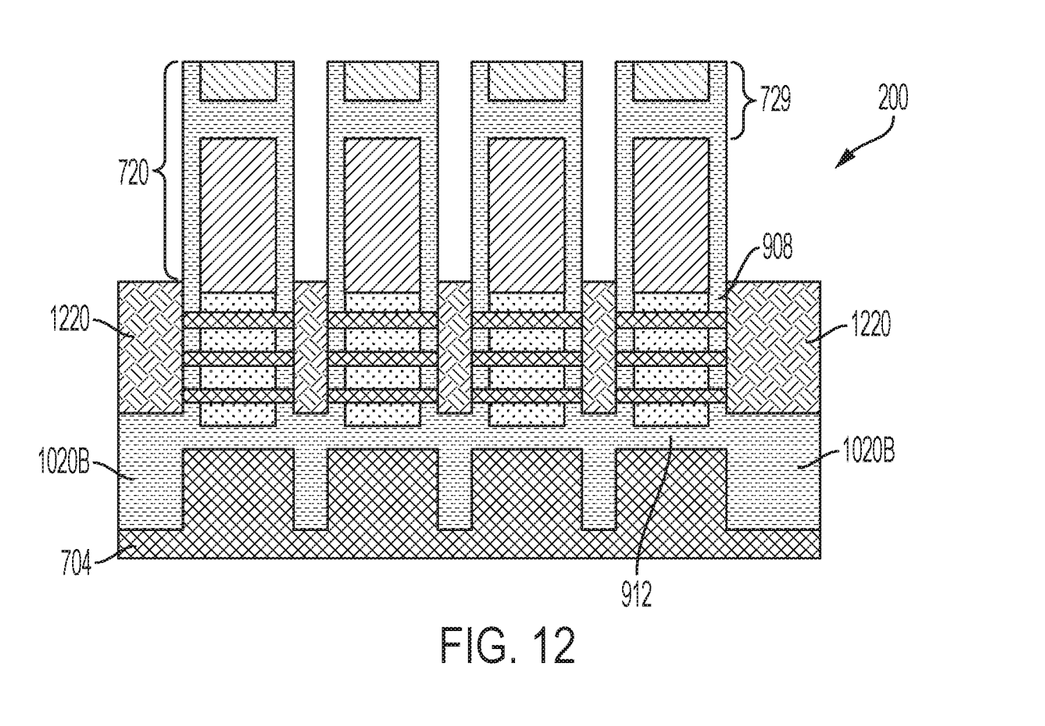
FIG. 12 depicts a cross-sectional view illustrating fabrication operations in accordance with embodiments of this invention.

FIG. 12 illustrates the formation of S/D structures 1220 in the S/D regions 810 (shown in FIG. 8). The S/D structures 1220 are formed on the substrate 704, such that each nanosheet 706 in contact with the S/D structures 1220 on both sides of the nanosheet 706. However, as shown in FIG. 12 there is no contact between the S/D structures 1220 and the substrate 704 because of "pinch off" in sacrificial bottom region 912. The S/D structures 120 can be doped by, for example, in-situ doping during epitaxial growth and/or diffusion and/or ion implantation.

In some embodiments, the sacrificial gate structures 120 and 720, and the remaining portions of the sacrificial layers are replaced with a metal gate (not shown). In still other embodiments, a metallization operation deposits a first contact (not shown) and a second contact (not shown) contacting the S/D structures 620 and 1220. Any known manner of depositing the first and second contacts can be utilized. In some embodiments, the ILD materials 410A and 1020B can be patterned with open trenches (not shown) and the first and second contacts are deposited into the trenches.

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
 forming a plurality of nanosheet stacks disposed above a substrate, each nanosheet stack comprising:
  a first nanosheet and a first sacrificial layer, the first nanosheet and the first sacrificial layer each having a first end and a second end, the first sacrificial layer comprising a first germanium content; and
  a bottom sacrificial layer formed on top of the substrate, the bottom sacrificial layer comprising a second germanium content higher than the first germanium content;
 forming a gate structure on each nanosheet stack;

recessing a portion of the nanosheet stacks and the substrate below a bottommost surface of the bottom sacrificial layer such that a distance "Dg" between adjacent gate structures is greater than a distance "Ds" between adjacent nanosheets stacks;

removing a portion of the first and second ends of the first sacrificial layer to expose portions of the first nanosheet;

removing the bottom sacrificial layer to form a cavity between the nanosheet stacks and the substrate;

forming an interlayer dielectric (ILD) layer around the plurality of nanosheet stacks in source/drain regions, the ILD layer filling the cavity; and forming source or drain (S/D) structures in the S/D regions in contact with the first end and the second end of the first nanosheet, wherein the S/D structures are isolated from the substrate by the ILD layer.

2. The method according to claim 1, wherein the gate structure comprises:
a gate having a first and a second gate sidewall; and
a hard mask on a top surface of the gate.

3. The method according to claim 1, wherein each nanosheet stack further comprises a plurality of vertically-stacked nanosheets alternating with a plurality of sacrificial layers disposed above the first nanosheet, such that each nanosheet is separated by a sacrificial layer and such that the substrate is separated from the nanosheet stack by the bottom sacrificial layer.

4. The method according to claim 3, wherein the sacrificial layers comprise silicon germanium (SiGe).

5. The method according to claim 4, wherein the sacrificial layers contain 25% to 50% of germanium (Ge).

6. The method according to claim 1, wherein the first sacrificial layer contains 25% of germanium (Ge) and the bottom sacrificial layer contains 50% of Ge.

7. A method of fabricating a semiconductor device, the method comprising:
forming a plurality of nanosheet stacks disposed above a substrate, each nanosheet stack comprising a plurality of vertically-stacked nanosheets having a first end and a second end alternating with a plurality of sacrificial layers comprising a first germanium content, the sacrificial layers having a first end and a second end disposed above the first nanosheet such that each nanosheet is separated by a sacrificial layer and such that the substrate is separated from the nanosheet stack by a bottom sacrificial layer comprising a second germanium content higher than the first germanium content;

forming a gate structure on each nanosheet stack;

recessing a portion of the nanosheet stacks and the substrate below a bottommost surface of the bottom sacrificial layer such that a distance "Dg" between adjacent gate structures is greater than a distance "Ds" between adjacent nanosheets stacks;

removing a portion of the first and second ends of the first sacrificial layers to expose portions of the first nanosheet;

removing the bottom sacrificial layer to form a cavity between the nanosheet stacks and the substrate;

forming an interlayer dielectric (ILD) layer around the plurality of nanosheet stacks in source or drain (S/D) regions, the ILD layer filling the cavity; and forming S/D structures in the S/D regions in contact with the first end and the second end of the vertically-stacked nanosheets, wherein the S/D structures are isolated from the substrate by the ILD layer.

8. The method according to claim 7, wherein the sacrificial layers comprise silicon germanium (SiGe).

9. The method according to claim 8, wherein the sacrificial layers contain 25% to 50% of germanium (Ge).

10. The method according to claim 7, wherein the sacrificial layers contain 25% of germanium (Ge) and the bottom sacrificial layer contains 50% of Ge.

11. The method according to claim 7, wherein the gate structure comprises:
a gate having a first and a second gate sidewall; and
a hard mask on a top surface of the gate.

* * * * *